United States Patent
Kawano

(10) Patent No.: US 7,928,016 B2
(45) Date of Patent: Apr. 19, 2011

(54) METHOD OF MANUFACTURING SEMICONDUCTOR DEVICE, AND SEMICONDUCTOR DEVICE

(75) Inventor: Hiroyuki Kawano, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/153,399

(22) Filed: May 19, 2008

(65) Prior Publication Data

US 2008/0296740 A1 Dec. 4, 2008

(30) Foreign Application Priority Data

May 31, 2007 (JP) ................................ 2007-145825

(51) Int. Cl.
*H01L 21/31* (2006.01)
(52) U.S. Cl. ........ 438/761; 438/597; 438/618; 438/703; 438/778; 438/791
(58) Field of Classification Search ................ 438/597, 438/618, 703, 761, 775, 778, 791, 958, FOR. 388, 438/FOR. 395, FOR. 401; 257/414, 418, 257/626, 632, 635, E23.002, E21.249, E21.627, E23.116, E23.077, E23.132, E21.641
See application file for complete search history.

(56) References Cited

U.S. PATENT DOCUMENTS

| 2002/0110982 | A1* | 8/2002 | Watatani | 438/256 |
| 2006/0077519 | A1* | 4/2006 | Floyd | 359/290 |
| 2007/0080383 | A1* | 4/2007 | Yamakawa et al. | 257/295 |

FOREIGN PATENT DOCUMENTS

| JP | 5006890 | 1/1993 |
| JP | 6291114 | 10/1994 |
| JP | 6333922 | 12/1994 |

* cited by examiner

*Primary Examiner* — N Drew Richards
*Assistant Examiner* — Joannie A Garcia
(74) *Attorney, Agent, or Firm* — Rabin & Berdo, P.C.

(57) ABSTRACT

A method for manufacturing a semiconductor device is provided that can reduce warping of manufactured products after the formation of a final protective film. The method includes, in a semiconductor device having a semiconductor substrate provided with wiring and a final protective film formed on the wiring, forming a first protective film on the wiring, forming a second protective film having tensile stress on the first protective film, and removing the first protective film and the second protective film from contact regions of the wiring.

20 Claims, 6 Drawing Sheets

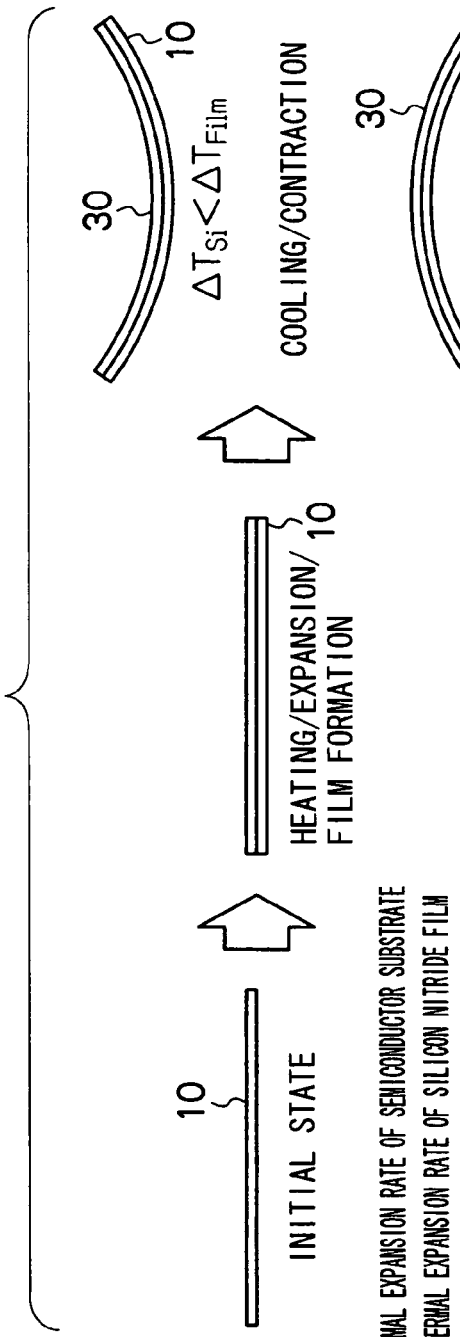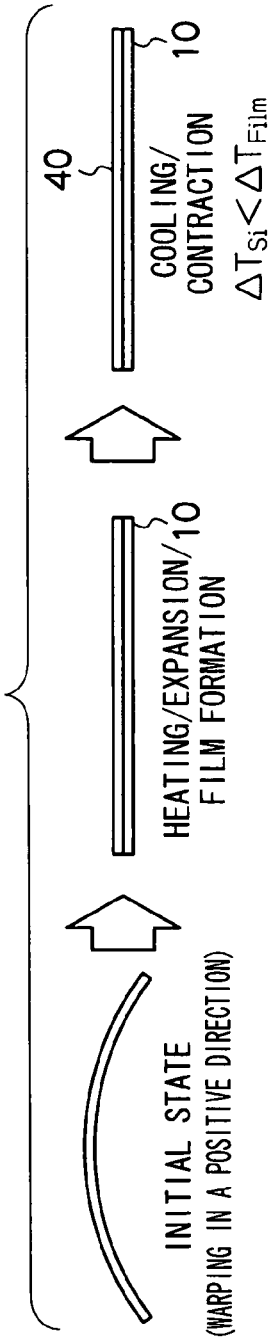

METHOD OF MANUFACTURING SEMICONDUCTOR DEVICE, AND SEMICONDUCTOR DEVICE

CROSS-REFERENCE TO RELATED APPLICATION

This application claims priority under 35 USC 119 from Japanese Patent Application No. 2007-145825, the disclosure of which is incorporated by reference herein.

BACKGROUND OF THE INVENTION

1. Field of the Invention

The present invention relates to a method of manufacturing a semiconductor device, and to a semiconductor device; in particular, it relates to a method of manufacturing a semiconductor device and a semiconductor device that can regulate the stress of a silicon nitride film which is used as a final protective film on wiring to suppress warping and deformation of wafers caused by distortion of specially manufactured products such as high-voltage products and MEMS (Micro Electro Mechanical Systems).

2. Description of Related Art

Final protective films (hereinafter sometimes referred to as "passivation films") used in current semiconductor products are, in the mainstream, plasma nitride films (hereinafter sometimes referred to as "P—SiN films") reaction-formed by the plasma CVD method with a gas mixture of $SiH_4$, $NH_3$ and $N_2$. When a standard P—SiN film is formed on a silicon (Si) substrate, compressive stress is observed, and depending on the conditions of formation, the stress can be controlled to within a range of about −50 MPa to −500 MPa (where the minus sign indicates the direction of compression). Further, this feature is not seen with other generally-used CVD methods (such as LP-CVD or normal pressure CVD methods) and, therefore, it is an extremely versatile process.

Recently, there has been demand for further miniaturization of devices and, together with this, a demand for passivation films having various characteristics. These characteristics concern the resistance of the passivation film, after formation thereof, to heat stress and mechanical stress in post-processing, as well as its ability to act as a barrier to the external atmosphere, with particular regard to humidity and the like. Moreover, together with the miniaturization of semiconductor devices and increases in multilayer wiring, electromigration and stress migration, in particular, have been focused on as the cause of faults which are known to affect the internal stress of the passivation film itself.

A technique in which a passivation film is formed as a single layer having low tensile stress in order to suppress the above migrations is disclosed in Japanese Patent Application Laid-Open (JP-A) No. 6-333922.

A multiple layer technique in which a passivation film has a two layer structure manufactured by a high density plasma CVD method, in which a film having low compressive stress is laminated on a film having high compressive stress, is disclosed in JP-A No. 5-6890. Further, a single layer passivation film in which a surface layer portion and a lower layer portion have different film qualities, and the lower layer portion has a low compressive stress, and the surface layer portion has excellent humidity resistance, is disclosed in JP-A No. 6-291114.

When forming the standard P—SiN film described above, the film is formed on a semiconductor substrate by high temperature heating at about 400° C. At this time, the semiconductor substrate (silicon substrate) expands in accordance with its inherent thermal expansion rate (<0.0003%/° C.). The P—SiN film formed on the semiconductor substrate does not exhibit stress at the time of forming and is thus stress-free with respect to the substrate. However, after the P—SiN film has been formed, the semiconductor substrate returns to a normal temperature and, due to the difference in thermal expansion rates between the semiconductor substrate and the P—SiN film, that is, due to the difference in respective contraction amounts thereof, the entire semiconductor substrate deforms and, usually, the P—SiN film contracts less than the semiconductor substrate after being formed, and the warping in the positive direction increases. Thus, since the thermal expansion rate of the P—SiN film is less than that of the semiconductor substrate, although it may be possible to reduce the warp amount in the positive direction by controlling the stress in the direction of compression, it is difficult to reverse the warp direction to a negative direction.

The formation and alleviation of warping of the semiconductor substrate using the passivation film described above is shown in FIG. 6A and FIG. 6B. In FIG. 6A, when a standard passivation film 30 is formed on a semiconductor substrate 10 that does not exhibit warping, warping occurs in the semiconductor substrate due to the differences in the thermal expansion (contraction) rates between the two. Further, in FIG. 6B, a semiconductor substrate 10 has in its initial state a convex warp toward an upper part thereof (hereinafter sometimes referred to as "positive direction warping"), and when a passivation film 40 having compression stress is deposited thereon, the warping of the semiconductor substrate is alleviated. However, as stated previously, since a standard P—SiN film has compressive stress, when a standard P—SiN film is formed on a semiconductor substrate having, in its initial state, a concave warp toward a lower part thereof (hereinafter sometimes referred to as "negative direction warping") it is difficult to alleviate the warping of the semiconductor substrate, since warping in a negative direction is promoted.

Generally, it is known that the humidity resistance of the passivation film improves when the internal stress of the film is a high compressive stress.

Thus, since the passivation film disclosed in JP-A No. 6-333922 is a single layer passivation film having tensile stress as internal stress, the humidity resistance thereof is poor. Further, even though stress is exhibited in a direction that alleviates warping in a negative direction, this stress is weak, and it is difficult to sufficiently alleviate warping in a negative direction. Moreover, even though the film can provide tensile stress, alleviating a concave warp toward a lower part of the semiconductor substrate is problematic.

Although the passivation film of JP-A No. 5-6890 has a laminated structure, since the internal stress of each of the film layers is compressive stress, it is difficult to alleviate warping of a semiconductor substrate in a negative direction. Further, because the film is formed by the high-density plasma CVD method, although the film quality is high, the manufacturing process is laborious, and thus it is impossible to avoid using a manufacturing process that differs greatly from conventional manufacturing processes.

Although the passivation film disclosed in JP-A No. 6-291114 has good humidity resistance at a surface portion thereof, each of the surface portion and the lower portion have compressive stress and, therefore, the warping of the semiconductor substrate in a negative direction is promoted, and it is difficult to alleviate the warping of the semiconductor substrate.

SUMMARY OF THE INVENTION

The present invention was accomplished in consideration of the above issues, and aims to achieve the following object.

Namely, the object of present invention is to provide a method of manufacturing a semiconductor device that can alleviate a concave warp toward a lower part of a semiconductor substrate, and to provide a semiconductor device.

The inventors of the present invention have, as a result of diligent effort, by laminating films having fixed properties, realized stress in a tensile direction not possible by conventional controls, and invented a method of manufacturing a semiconductor device that can achieve a passivation film having anti-corrosion properties (hereinafter sometimes referred to as "final protective film"), and a semiconductor device.

According to a first aspect of the method of manufacturing a semiconductor device of the present invention, there is provided a method of manufacturing a semiconductor device having a semiconductor substrate provided with wiring thereon and a final protective film comprising a first protective film and a second protective film formed in this order on the wiring, the method including:

forming the first protective film on the wiring;

forming the second protective film, which has tensile stress, on the first protective film; and removing the first protective film and the second protective film from contact regions of the wiring.

According to the first aspect of the method of manufacturing a semiconductor device of the present invention, a semiconductor device can be manufactured in which, due to the final protective film being a two layer structure, it is easy to configure a final protective film having fixed film characteristics and also having internal stress, as compared to a single layer film, and in which, since the second protective film has tensile stress, negative direction warping of the semiconductor substrate (a concave warp toward a lower part) can be suppressed.

In the second aspect of the present invention, the internal stress of the second protective film may be higher than the internal stress of the first protective film.

According to the second aspect of the method of manufacturing a semiconductor device of the present invention, in addition to the effects of the first aspect, the humidity resistance of the entire final protective film can be improved, due to the first protective film having better humidity resistance than the second protective film, either due to the first protective film having less tensile stress than the second protective film, or due to the first protective film having compressive stress.

In the third aspect of the present invention, the tensile stress of the second protective film may be from 400 MPa to 500 Mpa.

According to the third aspect of the method of manufacturing a semiconductor device of the present invention, in addition to the effects of the first and second aspects, since a final protective film having a large tensile stress can be formed by conventional manufacturing methods, the warping of the semiconductor substrate in a negative direction can be sufficiently alleviated.

In the fourth aspect of the present invention, the internal stress of the first protective film may be from −300 MPa to 50 Mpa.

According to the fourth aspect of the method of manufacturing a semiconductor device of the present invention, in addition to the effects of the first to third aspects, a final protective film may be formed having a laminated structure having tensile stress and excellent humidity resistance, due to either the first protective film having lower tensile stress than the second protective film, or due to the internal stress of the first protective film having compressive stress.

In the fifth aspect of the present invention, the first protective film and the second protective film may be formed by parallel plate plasma CVD.

According to the fifth aspect of the method of manufacturing a semiconductor device of the present invention, in addition to the effects of the first to third aspects, since each film may be manufactured by conventional parallel plate plasma CVD, warping of the semiconductor substrate in a negative direction (a concave warp toward a lower part) may be suppressed without the need to make major changes to conventional manufacturing processes.

The sixth aspect of the present invention provides a semiconductor device, including:

a semiconductor substrate;

wiring provided on the semiconductor substrate; and a final protective film formed on the wiring, wherein the final protective film is a two-layer structure, and the tensile stress of the final protective film is from 200 MPa to 400 MPa.

According to the sixth aspect of the present invention, even if a semiconductor substrate is formed having a concave warp toward a lower part, this can be alleviated due to the tensile stress of the final protective film.

According to the present invention, a method of manufacturing a semiconductor device that alleviates a concave warp toward a lower part of the semiconductor substrate, and a semiconductor device may be provided.

BRIEF DESCRIPTION OF THE DRAWINGS

Preferred exemplary embodiments of the present invention will be described in detail based on the following figures, wherein:

FIG. 6A shows a process of alleviating warping of a semiconductor substrate according to a conventional method of manufacturing a semiconductor substrate; and FIG. 6B shows a process of alleviating warping of a semiconductor substrate according to a conventional method of manufacturing a semiconductor substrate.

DETAILED DESCRIPTION OF THE INVENTION

A preferred embodiment of the method of manufacturing a semiconductor device of the present invention will now be described with reference to the drawings. Explanations may be omitted where they repeat previous description. Moreover, with regard to internal stress, a minus sign indicates compressive stress, and a plus sign (sometimes omitted) indicates tensile stress.

Method of Manufacturing a Semiconductor Device

The method of manufacturing a semiconductor device of the present invention includes, in a method in which wiring is provided on a semiconductor substrate, and a final protective film is formed on the wiring, forming a first protective film on the wiring, and forming a second protective film having tensile stress on the first protective film, and removing the first and second protective films from the contact regions of the wiring.

Further, the internal stress of the second protective film is preferably greater than that of the first protective film.

Figure 1:
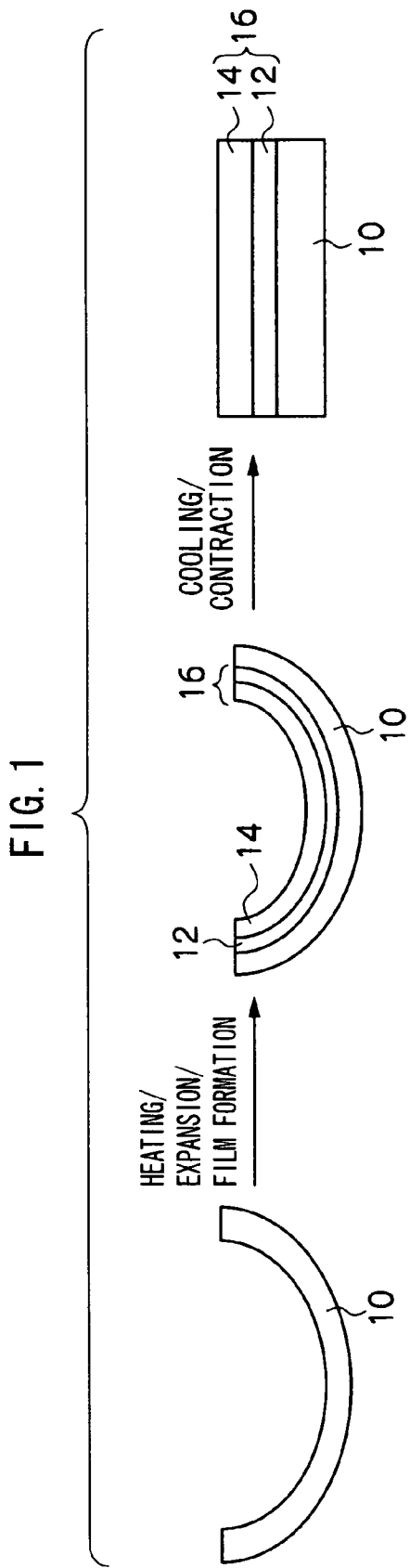
FIG. 1 shows the process of alleviating warping of a semiconductor substrate according to the method of manufacturing a semiconductor device of the present invention.

FIG. 1 shows a schematic sectional view of the process of reducing a concave warp toward a lower part of the substrate (hereinafter sometimes referred to as "negative direction warping"), in a substrate device manufactured by the above method, in which the chip mounting surface (the surface at the side on which the wiring is formed on the semiconductor substrate) side is the inner side.

First, when forming wiring (not shown) on the semiconductor substrate 10, due to thermal history at the time of forming the wiring, warping occurs at the semiconductor substrate 10. On the surface of the semiconductor substrate 10 having negative direction warping on which the wiring is thus formed, a first protective film 12 and a second protective film 14 are formed in this order, thus forming a final protective film 16 on the inner surface of a concave part, by plasma CVD heating, expansion and cooling. Subsequently, due to cooling and contraction, a semiconductor device may be formed having warping that has been alleviated.

In the method of manufacturing a semiconductor device of the present invention, it is preferable that the first protective film 12 and the second protective film 14 are formed by parallel plate plasma CVD. With the versatile method of parallel plate plasma CVD, as adjustments can be made to various conditions, a final protective film 16 having a high tensile stress may be formed without the need to make major changes to conventional manufacturing processes.

Each process will now be described in detail. Further, with regard to internal stress, a plus sign (sometimes omitted) indicates tensile stress, and a minus sign indicates compressive stress.

Process of Forming First Protective Film on Wiring

In the method of manufacturing a semiconductor device of the present invention, a first protective film is formed on wiring. The first protective film and the method of formation thereof will now be described in detail.

Method of Forming First Protective Film

In the method of forming the first protective film of the present invention, the film may be formed by a known plasma CVD method, and amongst these, it may be formed by the most versatile method, parallel plate plasma CVD. The conditions for forming two kinds of film, a standard protective film (hereinafter sometimes referred to as "P—SiN"), and a protective film having an internal stress of substantially 0 MPa, will now be described in detail.

As the gas for the plasma CVD, a mixture of $SiH_4$, $NH_3$ and $N_2$ may be used, and the flow rates thereof may be adjusted as necessary. When forming the P—SiN, the flow rates of each of $SiH_4$, $NH_3$ and $N_2$ may from 160 sccm to 180 sccm, 65 sccm to 85 sccm, and 1800 sccm to 2200 sccm, respectively.

In the case of LS-SiN, these flow rates may be from 180 sccm to 200 sccm, 65 sccm to 85 sccm, and 1800 sccm to 2200 sccm, respectively.

The film formation pressure may be from 0.55 kPa to 0.65 kPa for P—SiN, and from 0.55 kPa to 0.65 kPa for LS-SiN.

The high-frequency power may be from 400 W to 450 W for P—SiN, and from 380 W to 430 W for LS-SiN.

The electrode temperature may be from 350° C. to 400° C. for P—SiN, and from 350° C. to 400° C. for LS-SiN.

The distance between electrodes may be from 10 mm to 20 mm for P—SiN, and from 10 mm to 20 mm for LS-SiN.

The processing time may be adjusted appropriately depending on the thickness of the film to be formed.

First Protective Film

The first protective film of the present invention formed in the above manner contacts the wiring on a semiconductor substrate and, therefore, it is preferable that the internal stress of the first protective film is lower than that of the second protective film to be described below. Specifically, the internal stress of the first protective film is preferably −300 MPa to 50 MPa, and −50 MPa to 50 MPa is particularly preferable. If the internal stress is within this range, then due to the formation of the second protective film (described below) on the first protective film, warping of the semiconductor substrate in a negative direction can be alleviated and, moreover, since it is possible to form a film layer contacting the wiring that has excellent humidity resistance, it is also possible to suppress corrosion of the wiring. Further, the above value of the internal stress indicates the internal stress measured at the first protective film layer, upon forming the first protective film layer under the conditions for forming the first protective film, at the time of laminating the first protective film and the second protective film.

Investigation of the factors that regulate fixed internal stress reveals that factors regulating the thermal expansion rate of a semiconductor substrate (<0.0003%/° C.) greatly depend on the atoms that constitute a particular substance, and also on the bonding properties of various devices. Further, depending on the atoms or the bonding properties of the devices, the potential energy (atomic force) will differ and, generally, the atoms of substances having a deep potential energy are well aligned due to thermal oscillation, and the bond strength between the atoms is high. Consequently, the crystal hardness is also high, and the thermal expansion rate of the substance itself is low. Conversely, a substance having a low bond strength between the atoms thereof crystallizes weakly, and the thermal expansion rate thereof is thus high.

As a material for the first protective film of the present invention having these characteristics, a silica ($SiO_2$) film or a silica nitride ($Si_3N_4$) film may be used, although silica nitride is preferable due to its humidity resistance and acid resistance.

Figure 2:
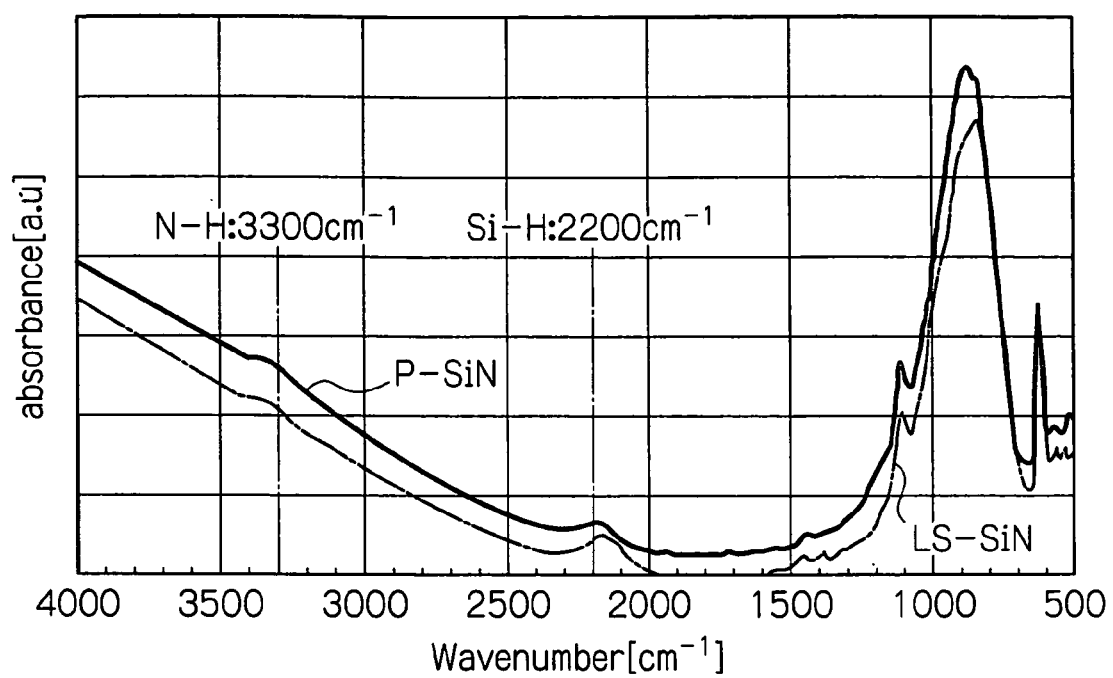
FIG. 2 shows FT-IR absorption spectrums of a standard silicon nitride film and a silicon nitride film having an internal stress of substantially 0 MPa, produced by the method of manufacturing a semiconductor device of the present invention.

Next, factors regulating the thermal expansion rate of silicon nitride will be described in detail. FIG. 2 shows the FT-IR (Fourier Transform Infrared spectroscopy) absorption spectrums of a standard silicon nitride film (P—SiN) and a silicon nitride film having an internal stress of substantially 0 MPa (LS-SiN). It can be seen that the location and height of the peaks for both films are similar.

Standard Silicon Nitride Film

A standard silicon nitride film has a prominent peak at a wavenumber of around 800 $cm^{-1}$ to 900 $cm^{-1}$, representing Si—N bonding, which is a stable bond that makes up a large part the P—SiN film. The broad peak at around 3300 $cm^{-1}$ represents N—H bonding (bond dissipation energy: 386 KJ/mol), and at around 2200 $cm^{-1}$, Si—H bonding occurs (bond dissipation energy: 318 KJ/mol). Thus, in the P—SiN film, hydrogen atoms introduced into the film are introduced in various states of bonding, each exhibiting a proper oscillation.

The internal stress of this kind of P—SiN film is −300 MPa to −50 MPa.

LS-SiN Film

In comparison, in the Ls-SiN film having an internal stress of substantially 0 Mpa, the bonding state of the hydrogen atoms is an N—H bond, and since the bond dispersion energy decreases due to a shift towards an Si—H bond at a lower wavenumber side, the thermal expansion coefficient and the internal stress decrease. The internal stress of such an LS-SiN film is −50 MPa to 50 MPa.

Thus, by forming a first protective film that has an internal stress from −300 MPa to 50 MPa, and that has a second protective film formed thereon, warping in a negative direction of a semiconductor substrate may be alleviated, and a final protective film that that has excellent humidity resistance may be formed.

Figure 3:
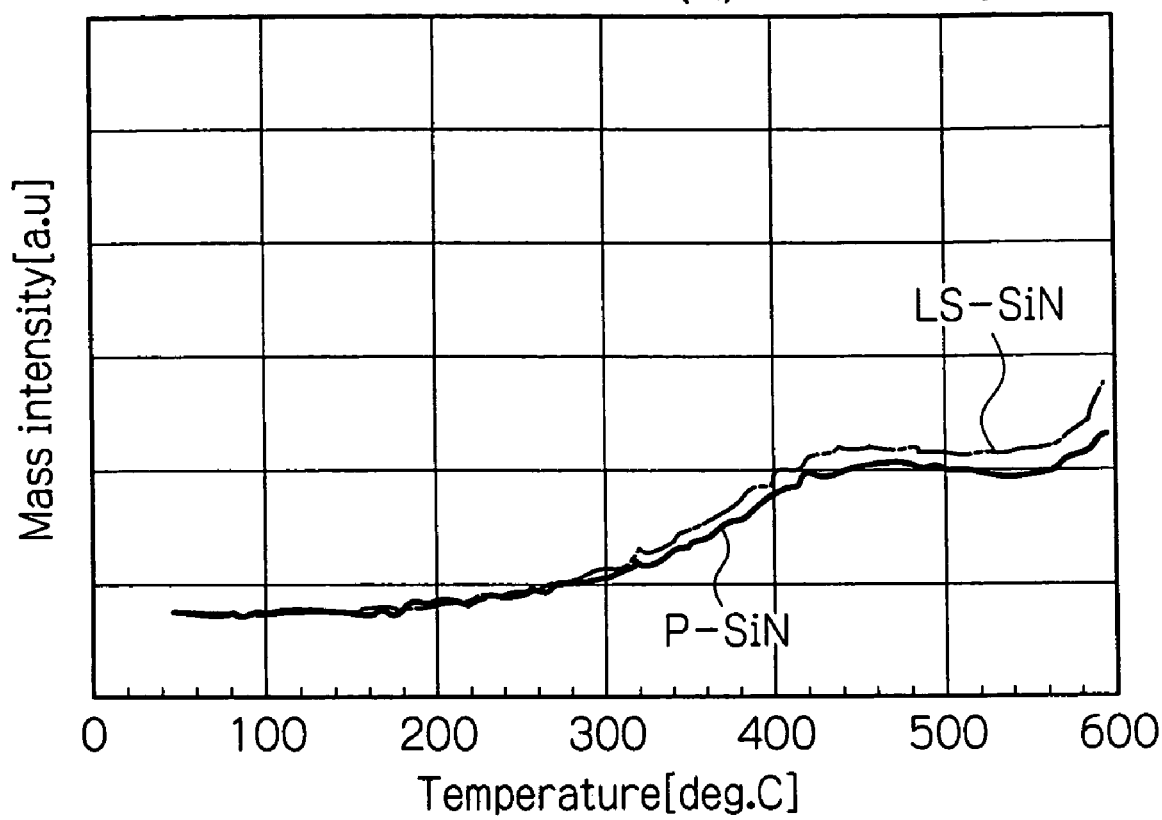
FIG. 3 shows desorption amounts of hydrogen (H), obtained by temperature desorption gas analysis, of a standard silicon nitride film and a silicon nitride film having an internal stress of substantially 0 MPa, produced by the method of manufacturing a semiconductor device of the present invention.

The hydrogen (H) desorption amounts for these films, obtained by thermal desorption analysis, are shown in FIG. 3. Here, thermal desorption analysis indicates a method in which a sample placed in a high vacuum is heated, and desorbed gas components are identified by a quadrupole mass spectrometer (Q-Mass). Thereby, the components in the sample and, in particular, hydrogen and moisture, can be subject to qualitative analysis with high sensitivity. In the present evaluation, measurements were made focusing particularly on atomic mass number 1, that is, hydrogen.

It can be seen from FIG. 3 that the hydrogen desorption amounts of both a P—SiN film and an LS-SiN film are similar, and that the film characteristics thereof are also similar. Moreover, the dry etching rates, which are an indicator of processability, of both the P—SiN film and the LS-SiN film are similar, and the wet etching rates, which are an indicator of humidity resistance, are also similar. Therefore, an LS-SiN film has similar processability and humidity resistance to a P—SiN film, and since the internal stress thereof is also alleviated, it is possible to avoid stress on the wiring when the film is used in a final protective film having a laminated structure and, in particular, when the film is used on the side that contacts the wiring, and thus it is very useful.

Forming a Second Protective Film Having Tensile Stress on the First Protective Film The method of manufacturing a semiconductor device of the present invention includes forming, on the first protective film, a second protective film that has higher tensile stress than the first protective film. The method of forming the second protective film, and the second protective film itself, will now be described in detail.

Method of Forming the Second Protective Film

In the method of forming the second protective film of the present invention, the second protective film may be formed on the first protective film by conventional parallel plate plasma CVD, similar to the formation of the first protective film.

As the gas for the plasma CVD, a mixture of $SiH_4$, $NH_3$, and $N_2$ may be used and the flow rates of these gases may be adjusted as appropriate. Specifically, the flow rates of each of $SiH_4$, $NH_3$, and $N_2$ may be from 50 sccm to 70 sccm, from 70 sccm to 90 sccm, and from 1800 sccm to 2200 sccm, respectively. With these flow rates, hydrogen in the film may remain as part of an N—H bond.

The formation pressure of the film may be from 0.65 kPa to 0.75 kPa.

As it is important to control the bond dissolution energy mentioned above, the high frequency power may be from 230 W to 310 W, more preferably from 250 W to 290 W, and particularly preferably from 250 W to 270 W.

The electrode temperature may be from 350° C. to 400° C.

The distance between the electrodes may be from 10 mm to 20 mm.

The processing time may be adjusted appropriately depending on the thickness of the film to be formed.

Second Protective Film

The internal stress of the second protective film of the present invention is tensile stress. Due to this, the stress in the film in the final protective film may be tensile stress, and thus it is possible to suppress warping of the semiconductor substrate after formation of the final protective film. Moreover, the film characteristics do not deteriorate, and a final protective film may be formed that has excellent humidity resistance.

Figure 4:
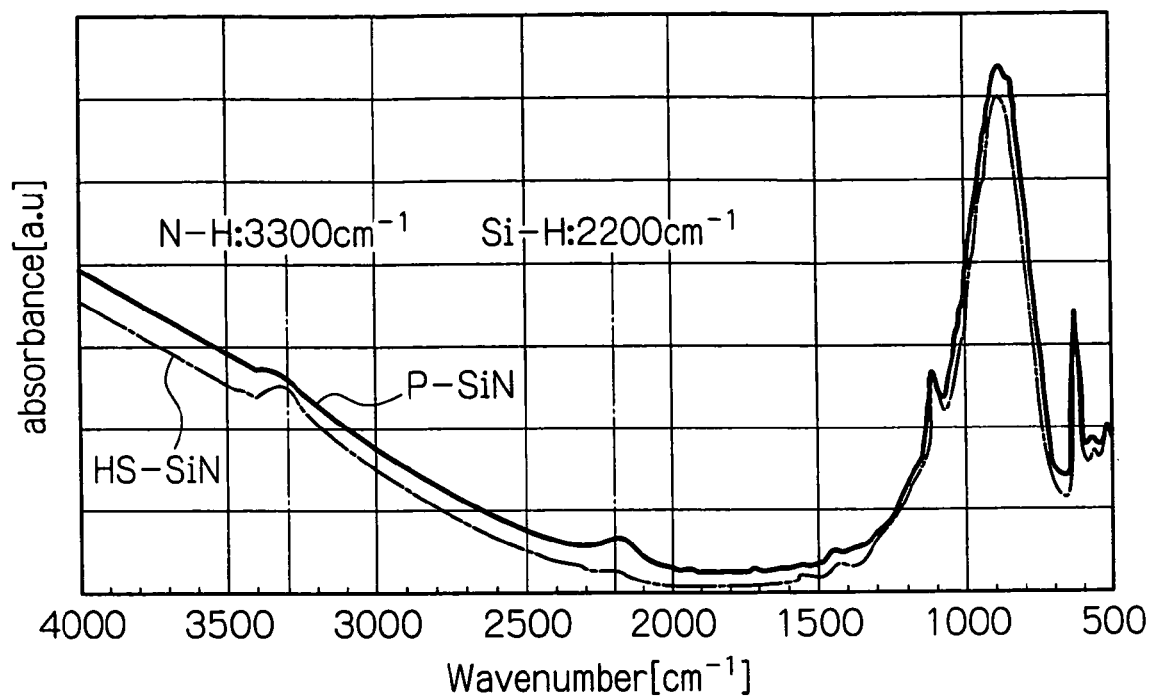
FIG. 4 shows FT-IR absorption spectrums of a standard silicon nitride film and a silicon nitride film having high tensile stress, produced by the method of manufacturing a semiconductor device of the present invention.

In the second protective film, similarly to the first protective film, the stress may be regulated by adjusting the thermal expansion rate. FIG. 4 shows FT-IR (Fourier Transform Infrared spectroscopy) absorption spectrums for a P—SiN film and a silicon nitride film having high tensile stress (hereinafter, sometimes referred to as an "HS-SiN film").

In the second protective film of the present invention, similar to the P—SiN film, a prominent peak may be seen at a wavenumber of around 800 $cm^{-1}$ to 900 $cm^{-1}$, and this indicates Si—N bonding, which is a stable bond that makes up a large portion of the P—SiN film. However, at around 2200 $cm^{-1}$, Si—H bonding may be seen, and due to a shift to N—H bonding at a higher wavenumber side, the bond dissolution energy of the film increases, and thus the thermal expansion coefficient and the internal stress increase. The internal stress of such an HS-SiN film is preferably 400 MPa to 500 MPa, and particularly preferably 400 MPa to 450 MPa. If the tensile stress is greater than 500 MPa, the humidity resistance of the final protective film worsens, and if it is less than 400 MPa, it becomes difficult to alleviate warping in the semiconductor substrate. Note that this internal stress is tensile stress. Further, the above value of the internal stress indicates the internal stress measured at the second protective film layer, upon formation the second protective film layer according to the conditions for forming the second protective film, at the time of laminating the first protective film and the second protective film.

In this way, by setting the internal stress of the second protective film to be within the above range, the entirety of a final protective film formed of the first protective film and the second protective film may have tensile stress, and the amount of warping of an inner surface of a semiconductor substrate that has warping in a negative direction that occurs after formation, may be reduced.

Figure 5:
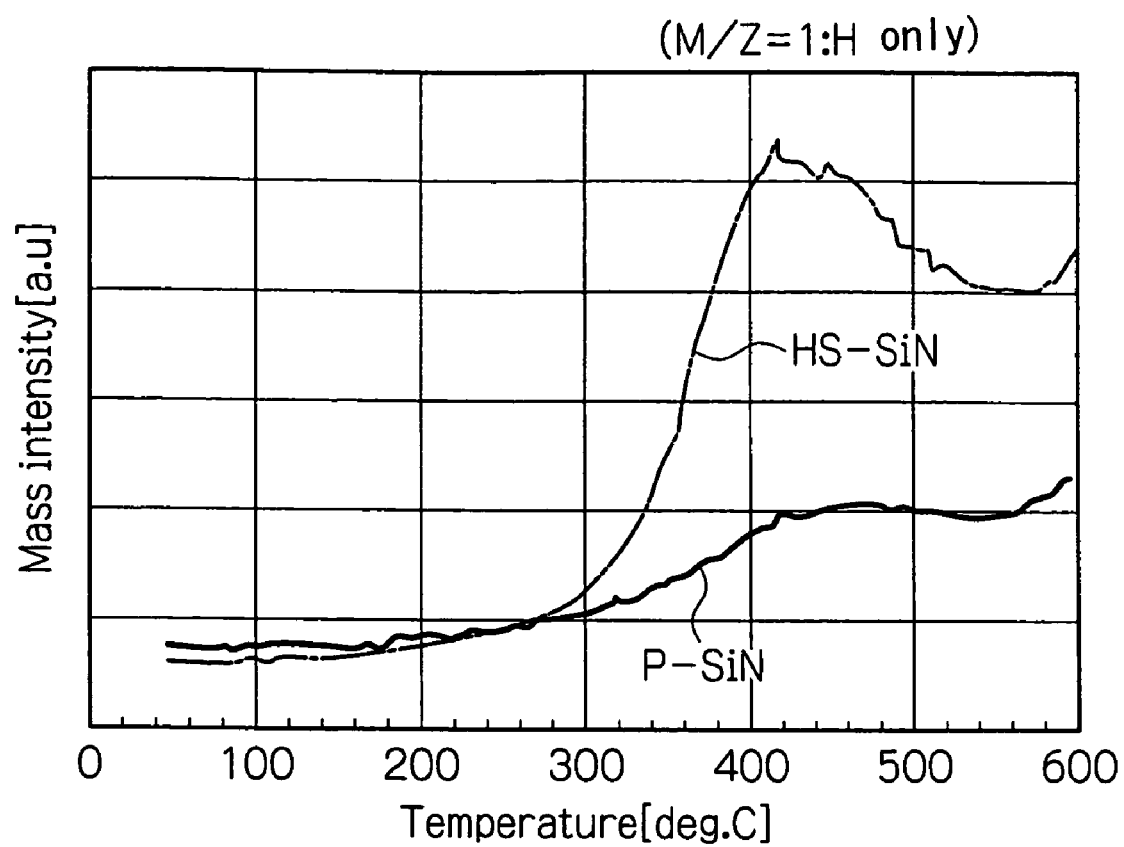
FIG. 5 shows desorption amounts of hydrogen (H), obtained by temperature desorption gas analysis, of a standard silicon nitride film and a silicon nitride film having high tensile stress, produced by the method of manufacturing a semiconductor device of the present invention.

The results of thermal desorption analysis for hydrogen (H) desorption amounts of the P—SiN film and the HS-SiN film are shown in FIG. 5. It can be seen from FIG. 5 that the HS-SiN film has a greater hydrogen desorption amount. From these results, it may be understood that it is important to focus on the amount of hydrogen included in the film and the states of bonding thereof when adjusting conditions.

Further, the materials for the second protective film are similar to those of the first protective film.

Removing the First Protective Film and the Second Protective Film from the Contact Regions of the Wiring The method of manufacturing a semiconductor device of the present invention includes removing the first protective film and the second protective film from the contact regions of the wiring.

The removal method may be a conventional photolithography or etching method.

From the above, since in the method of manufacturing a semiconductor device of the present invention, manufacturing processes similar to conventional processes may be used, it is possible to substitute conventional processes with comparative ease.

Semiconductor Device

The semiconductor device of the present invention is a semiconductor substrate provided with wiring thereon, with a final protective film formed on the wiring, the protective film having a two layer structure, and the tensile strength of the final protective film being 200 MPa to 400 MPa.

The semiconductor device of the present invention may be manufactured by the above-described method of manufacturing a semiconductor device. The final protective film, and the semiconductor substrate will now be described in detail.

Final Protective Film after Lamination

To obtain a semiconductor device having high reliability, and to alleviate warping, the ratio of thickness of the first protective film to the second protective film is preferably from 5000 Å:10,000 Å to 6000 Å:10,000 Å.

To obtain a maximum warp reduction effect in a laminated structure, the ratio of stress of the first protective film to the second protective film is preferably an absolute value of from −50 MPa:400 MPa to 0 MPa:450 MPa, and particularly preferably from 0 MPa:450 MPa to 50 MPa:500 MPa.

To suppress the amount of warping due to the thermal expansion rate of the semiconductor substrate, the tensile stress of the final protective film including a laminate of the first and second protective films may be from 200 MPa to 400 MPa, and is particularly preferably from 250 MPa to 350 MPa. Within this range it is possible to sufficiently alleviate warping in a negative direction.

Further, the second protective film may be formed consecutively after forming the first protective film while a semiconductor device is still in a plasma CVD device chamber, and thus a final protective film can be formed in a similar manner to conventional processes.

Semiconductor Substrate

The semiconductor substrate of the present invention may be a silicon substrate, an SOI (silicon on insulator) substrate, or the like, and the wiring may include copper (Cu) or aluminum (Al).

The method of manufacturing a semiconductor substrate of the present invention may be applied advantageously not only for a CMOS device, but also for MEMS and specially manufactured products such as high pressure resistant products.

Further, the present exemplary embodiment should not be interpreted as limiting, and the present invention may be implemented in any way as long as the necessary conditions of the present invention are satisfied.

EXAMPLES

Next, the present invention will be explained in detail by describing examples; however, the present invention is not limited thereby.

The examples of the present invention include a first example in which a standard silicon nitride film (lower layer: first protective film; P—SiN) is formed, and a silicon nitride film having high tensile stress (upper layer: second protective film; HS-SiN) is subsequently formed, and a second example in which a silicon nitride film having an internal stress of substantially 0 (lower layer: first protective film; LS-SiN) is formed and a silicon nitride film having high tensile stress is subsequently formed (upper layer: second protective film; HS-SiN).

Comparative examples include a first comparative example in which a standard silicon nitride film (first protective film; P—SiN) is formed as a single layer and a second comparative example in which a silicon nitride film having a tensile strength of substantially 0 is formed (first protective film; LS-SiN) is formed as a single layer. In a third comparative example, the upper and lower layers of the first exemplary embodiment are formed in reverse order. The following describes the above in more detail.

Example 1

Method of Manufacturing of Example 1

First, a silicon semiconductor substrate having Al wiring formed thereon is mounted at a plasma CVD device (manufacturer: AMAT, model number: Precision-5000CVD), and according to the conditions indicated in Table 1 regarding gas flow rate, formation pressure, high frequency power, electrode temperature and the distance between electrodes, a standard silicon nitride film (P—SiN film) having a film thickness of 0.6 μm is formed as a lower layer (first protective film); subsequently, a silicon nitride film having a high tensile strength (HS—SiN film) and having a film thickness of 1.0 μm is formed as an upper layer (second protective film).

TABLE 1

|  |  | LOWER LAYER: P-SiN FILM | UPPER LAYER: HS-SiN FILM |
|---|---|---|---|
| GAS FLOW RATE (sccm) | $SiN_4$ | 170 | 60 |
|  | $NH_3$ | 75 | 80 |
|  | $N_2$ | 2000 | 2000 |
| FORMATION PRESSURE (kPa) |  | 0.60 | 0.67 |
| HIGH FREQUENCY POWER (W) |  | 435 | 260 |
| ELECTRODE TEMPERATURE (° C.) |  | 400 | 400 |
| DISTANCE BETWEEN ELECTRODES (mm) |  | 15.2 | 15.2 |

Evaluation

The film thickness, internal stress, manufacturability, humidity resistance and warp deformation of a film formed in the above manner were evaluated. Manufacturability was evaluated by evaluating the dry etching rate. For evaluating humidity resistance, the wet etching rate was used as an indicator of resistance to humidity.

Thickness of the Film Formed

Using an optical film thickness measuring device (manufactured by KLA-Tencor; UV-1250), the thickness of the film deposited on the silicon substrate was measured by visible light.

Internal Stress

Using a laser reflection warping measuring device (manufactured by KLA-Tencor; FLX-5200h), the amount of warping before and after formation of the film was measured, and the internal stress value was calculated. Regarding the value, a plus sign (sometimes omitted) indicates tensile stress, and a minus sign indicates compressive stress.

Warping Deformation

Using a laser reflection warping measuring device (manufactured by KLA-Tencor; FLX-5200h), the amount of warping before and after formation of the film was measured.

Manufacturability (Dry Etching Rate)

The etching rate was calculated per unit of time, based on the reduction in the amount of film after processing thereof, using a $CF_4/O_2/CHF_3/Ar$ gas dry etching device (manufactured by Tokyo Electron, UNITY-65DP).

Further, in the case of a laminated structure, only the upper film (HS-SiN) was processed and the result thereof was calculated.

Humidity Resistance (Wet Etching Rate)

A semiconductor substrate formed in the above manner was immersed for one minute in hydrofluoric acid dispersed in pure water at a 5% concentration (hereinafter sometimes referred to as "BHF"), and the etching rate per unit of time was calculated based on the reduction in the amount of film after processing thereof. The greater the wet etching rate, the poorer the humidity resistance.

Further, in the case of a laminated structure, only the upper film (HS-SiN) was processed, and the result thereof was calculated.

The results of the above evaluations are shown in Table 3.

Example 2

Manufacturing Method of Example 2

In Example 2, a semiconductor substrate was manufactured in a similar manner to Example 1, except that the upper and lower layers were configured according to Table 2 below, and the resulting substrate was evaluated. The results are shown in Table 3.

TABLE 2

|  |  | LOWER LAYER: LS-SiN FILM | UPPER LAYER: HS-SiN FILM |
|---|---|---|---|
| GAS FLOW RATE (sccm) | $SiN_4$ | 190 | 60 |
|  | $NH_3$ | 75 | 80 |
|  | $N_2$ | 2000 | 2000 |
| FORMATION PRESSURE (kPa) |  | 0.60 | 0.67 |
| HIGH FREQUENCY POWER (W) |  | 400 | 260 |
| ELECTRODE TEMPERATURE (° C.) |  | 400 | 400 |
| DISTANCE BETWEEN ELECTRODES (mm) |  | 15.2 | 15.2 |

Comparative Examples 1-3

Method of Manufacturing Comparative Examples 1-3

In Comparative Example 1, a semiconductor substrate was manufactured in a similar manner to Example 1, except that the HS-SiN film was not formed, and only a P—SiN film was formed, and Comparative Example 1 was evaluated in a similar manner to Example 1.

In Comparative Example 2, a semiconductor substrate was manufactured in a similar manner to Example 1, except an HS-SiN film was not formed, and only an LS-SiN film was formed, and Comparative Example 2 was evaluated in a similar manner to Example 1.

In Comparative Example 3, a semiconductor substrate was manufactured in a similar manner to Example 1, except that a P—SiN film was formed on an HS-SiN film after formation of the HS-SiN film, and Comparative Example 3 was evaluated in a similar manner to Example 1.

Further, regarding the evaluation of the dry etching rate and the wet etching rate, due to the laminated structure of Comparative Example 3, only the upper layer film (P—SiN) was processed, and the results thereof were calculated.

The results of these evaluations are shown in Table 3.

TABLE 3

|  | FILM STRUCTURE |  | FILM THICKNESS (nm) | INTERNAL STRESS (MPa) | DRY ETCHING RATE (nm/min) | WET ETCHING RATE (nm/min) | WARPING (μm) |
|---|---|---|---|---|---|---|---|
| EXAMPLE 1 | LAMINATED | UPPER LAYER: HS-SiN | 10085 | 426 | 261 | 10779 | 895 | -63.4 |
|  |  | LOWER LAYER: P-SiN | 6030 | -60 |  |  |  |  |
| EXAMPLE 2 | LAMINATED | UPPER LAYER: HS-SiN | 10085 | 426 | 318 | 10779 | 895 | -73.9 |
|  |  | LOWER LAYER: LS-SiN | 5700 | 5.7 |  |  |  |  |

TABLE 3-continued

| | FILM STRUCTURE | | FILM THICK-NESS (nm) | INTERNAL STRESS (MPa) | | DRY ETCHING RATE (nm/min) | WET ETCHING RATE (nm/min) | WARPING (μm) |
|---|---|---|---|---|---|---|---|---|
| COMPARATIVE EXAMPLE 1 | SINGLE LAYER | P-SiN | 8098 | −59 | | 9513 | 202 | 7.6 |
| COMPARATIVE EXAMPLE 2 | SINGLE LAYER | LS-SiN | 8133 | 5.7 | | 9531 | 215 | −1.0 |
| COMPARATIVE EXAMPLE 3 | LAMINATED | UPPER LAYER: P-SiN | 6030 | −60 | 260 | 9513 | 202 | −63.5 |
| | | LOWER LAYER: HS-SiN | 10085 | 426 | | | | |

Thus, it is clear that a semiconductor device manufactured by the manufacturing method for a semiconductor device of the present invention has manufacturability and humidity resistance comparable to conventional final protective layers, and moreover, can suppress the amount of warping deformation of a semiconductor substrate.

What is claimed is:

1. A method of manufacturing a semiconductor device having a semiconductor substrate provided with wiring thereon and a final protective film comprising a first protective film and a second protective film formed in this order on the wiring, the method comprising:
    forming the wiring on a semiconductor substrate;
    forming the first protective film on the wiring;
    forming the second protective film under tensile stress on the first protective film; and
    removing the first protective film and the second protective film from contact regions of the wiring,
    wherein the first protective film and the second protective film are formed contiguously across the substrate.

2. The method of manufacturing a semiconductor device of claim 1, wherein an internal stress of the second protective film is higher than an internal stress of the first protective film.

3. The method of manufacturing a semiconductor device of claim 1, wherein the tensile stress of the second protective film is from 400 MPa to 500 Mpa.

4. The method of manufacturing a semiconductor device of claim 2, wherein the tensile stress of the second protective film is from 400 MPa to 500 Mpa.

5. The method of manufacturing a semiconductor device of claim 1, wherein an internal stress of the first protective film is from −300 MPa to 50 Mpa.

6. The method of manufacturing a semiconductor device of claim 2, wherein the internal stress of the first protective film is from −300 MPa to 50 Mpa.

7. The method of manufacturing a semiconductor device of claim 3, wherein an internal stress of the first protective film is from −300 MPa to 50 Mpa.

8. The method of manufacturing a semiconductor device of claim 4, wherein the internal stress of the first protective film is from −300 MPa to 50 Mpa.

9. The method of manufacturing a semiconductor device of claim 1, wherein the first protective film and the second protective film are formed by parallel plate plasma CVD.

10. The method of manufacturing a semiconductor device of claim 1, wherein the final protective film is a passivation film.

11. A method of manufacturing a semiconductor device having a semiconductor substrate provided with wiring thereon and a final protective film comprising a first protective film and a second protective film formed in this order on the wiring, the method comprising:
    forming the wiring on a semiconductor substrate;
    forming the first protective film on the wiring;
    forming the second protective film under tensile stress on the first protective film; and
    removing the first protective film and the second protective film from contact regions of the wiring,
    wherein the second protective film is formed contiguously across the substrate.

12. The method of manufacturing a semiconductor device of claim 11, wherein an internal stress of the second protective film is higher than an internal stress of the first protective film.

13. The method of manufacturing a semiconductor device of claim 11, wherein the tensile stress of the second protective film is from 400 MPa to 500 Mpa.

14. The method of manufacturing a semiconductor device of claim 12, wherein the tensile stress of the second protective film is from 400 MPa to 500 Mpa.

15. The method of manufacturing a semiconductor device of claim 11, wherein an internal stress of the first protective film is from −300 MPa to 50 Mpa.

16. The method of manufacturing a semiconductor device of claim 12, wherein the internal stress of the first protective film is from −300 MPa to 50 Mpa.

17. The method of manufacturing a semiconductor device of claim 13, wherein an internal stress of the first protective film is from −300 MPa to 50 Mpa.

18. The method of manufacturing a semiconductor device of claim 14, wherein the internal stress of the first protective film is from −300 MPa to 50 Mpa.

19. The method of manufacturing a semiconductor device of claim 11, wherein the first protective film and the second protective film are formed by parallel plate plasma CVD.

20. The method of manufacturing a semiconductor device of claim 11, wherein the final protective film is a passivation film.

* * * * *